United States Patent
Jeon et al.

(10) Patent No.: US 12,249,595 B2
(45) Date of Patent: Mar. 11, 2025

(54) SEMICONDUCTOR LIGHT EMITTING DEVICE AND METHOD FOR MANUFACTURING THE SAME

(71) Applicant: Lumens Co., Ltd., Yongin-si (KR)

(72) Inventors: Soo Kun Jeon, Gyeonggi-do (KR); Geun Mo Jin, Gyeonggi-do (KR)

(73) Assignee: Lumens Co., Ltd., Yongin-si (KR)

( * ) Notice: Subject to any disclaimer, the term of this patent is extended or adjusted under 35 U.S.C. 154(b) by 379 days.

(21) Appl. No.: 17/773,899

(22) PCT Filed: Oct. 14, 2020

(86) PCT No.: PCT/KR2020/013994
§ 371 (c)(1),
(2) Date: May 3, 2022

(87) PCT Pub. No.: WO2021/125524
PCT Pub. Date: Jun. 24, 2021

(65) Prior Publication Data
US 2022/0384397 A1 Dec. 1, 2022

(30) Foreign Application Priority Data
Dec. 19, 2019 (KR) .................. 10-2019-0170642

(51) Int. Cl.
*H01L 25/075* (2006.01)
*H01L 33/00* (2010.01)
(Continued)

(52) U.S. Cl.
CPC ...... *H01L 25/0753* (2013.01); *H01L 33/0093* (2020.05); *H01L 33/42* (2013.01);
(Continued)

(58) Field of Classification Search
CPC . H01L 25/0753; H01L 33/0093; H01L 33/42; H01L 33/50; H01L 33/52; H01L 33/58; H01L 33/62
(Continued)

(56) References Cited

U.S. PATENT DOCUMENTS

2010/0006864 A1* 1/2010 Steigerwald ............ H01L 33/22
257/E33.056
2017/0358624 A1* 12/2017 Takeya .................... H01L 33/42
(Continued)

FOREIGN PATENT DOCUMENTS

JP 2015-073043 A 4/2015
KR 10-2014-0110257 A 9/2014
(Continued)

OTHER PUBLICATIONS

International Search Report from corresponding PCT Application No. PCT/KR2020/013994, dated Jan. 19, 2021.

Primary Examiner — Jami Valentine Miller
Assistant Examiner — Ashley Nicole Blackwell
(74) Attorney, Agent, or Firm — PnK IP LLC

(57) ABSTRACT

The present disclosure relates to a semiconductor light emitting device and a method for manufacturing the same. The semiconductor light emitting device comprises: one or more light emitting units, each including a first semiconductor layer, an active layer and a second semiconductor layer sequentially formed on a growth substrate; an electrode unit including a first semiconductor layer having a first conductivity and a metal layer formed on the first semiconductor layer; and one or more bonding layers for electrically connecting to the light emitting units and electrode unit, respectively, wherein each bonding layer has a first region on which the light emitting units and the electrode unit are arranged, and a second region having a larger planar area (Continued)

than that of the first region and being electrically connected to an external substrate.

14 Claims, 12 Drawing Sheets

(51) Int. Cl.
    *H01L 33/42*      (2010.01)
    *H01L 33/50*      (2010.01)
    *H01L 33/52*      (2010.01)
    *H01L 33/58*      (2010.01)
    *H01L 33/62*      (2010.01)

(52) U.S. Cl.
    CPC .............. *H01L 33/50* (2013.01); *H01L 33/52* (2013.01); *H01L 33/58* (2013.01); *H01L 33/62* (2013.01); *H01L 2933/0016* (2013.01); *H01L 2933/0041* (2013.01); *H01L 2933/005* (2013.01); *H01L 2933/0058* (2013.01); *H01L 2933/0066* (2013.01)

(58) Field of Classification Search
    USPC .......................................................... 257/89
    See application file for complete search history.

(56) References Cited

U.S. PATENT DOCUMENTS

2019/0229097 A1* 7/2019 Takeya ................ H01L 33/0093
2020/0013759 A1* 1/2020 Yoo ........................ H01L 25/167

FOREIGN PATENT DOCUMENTS

| KR | 10-2017-0071670 A | 6/2017 |
| KR | 10-2017-0095450 A | 8/2017 |
| WO | WO-2019/125051 A1 | 6/2019 |

* cited by examiner (a)

(b)

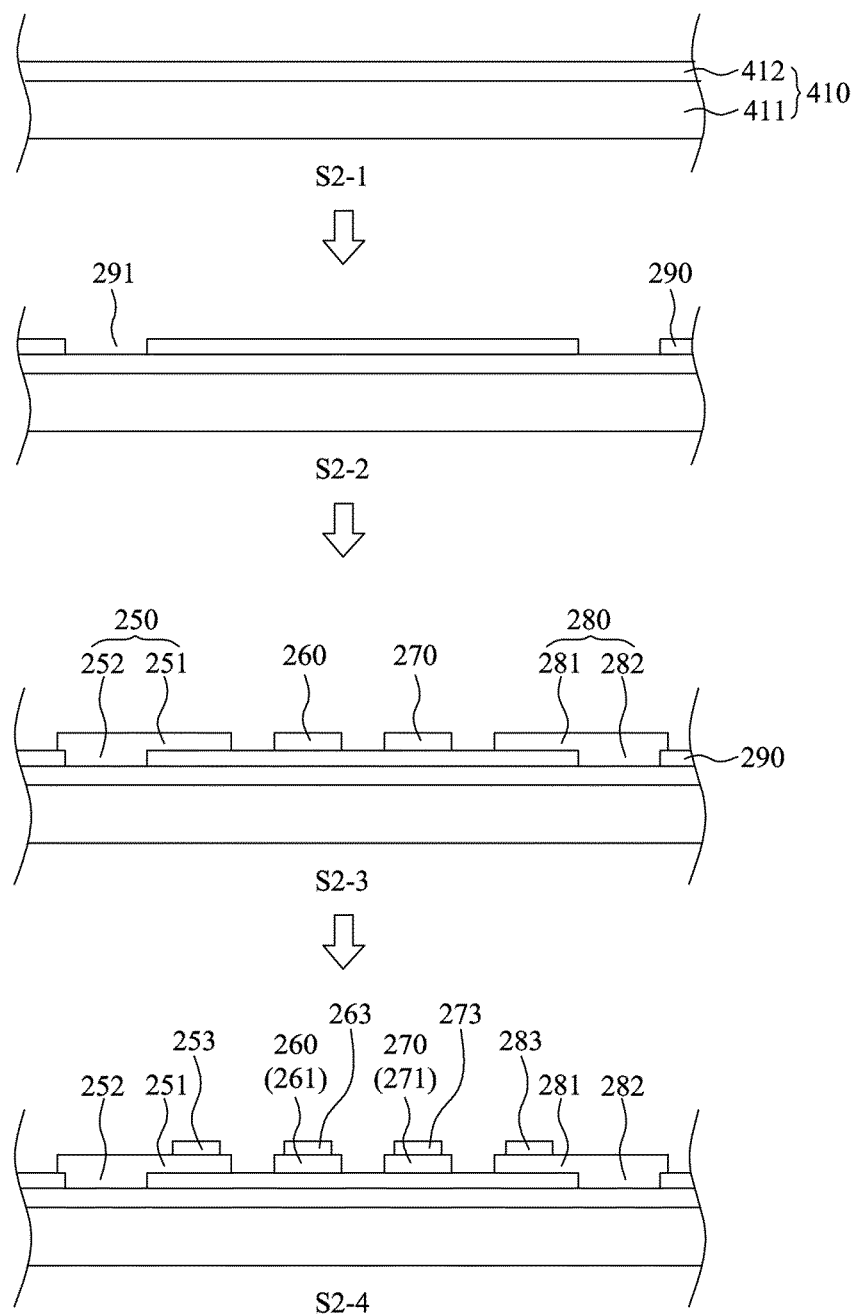

SEMICONDUCTOR LIGHT EMITTING DEVICE AND METHOD FOR MANUFACTURING THE SAME

CROSS-REFERENCE TO RELATED APPLICATIONS

This application is a national phase application of PCT Application No. PCT/KR 2020/013994, filed on 14 Oct. 2020, which claims priority to Korean Patent Application No. 10-2019-0170642, filed on 19 Dec. 2019. The entire disclosure of the applications identified in this paragraph is incorporated herein by reference.

FIELD

The present disclosure relates generally to a semiconductor light emitting device and a method for manufacturing the same. More particularly, it relates to a semiconductor light emitting device including plural micro semiconductor light emitting chips and a method for manufacturing the same.

In the context herein, the term "semiconductor light emitting chip" refers to a semiconductor optoelectronic device which generates light by electron-hole recombination. One example thereof is Group III-nitride semiconductor optical devices (LEDs, LDs), in which the Group III-nitride semiconductor is composed of a compound of $Al(x)Ga(y)In(1-x-y)N$ ($0 \leq x \leq 1$, $0 \leq y \leq 1$, $0 \leq x+y \leq 1$). Another example thereof is GaAs-based semiconductor light emitting chips used for emitting red light.

BACKGROUND

This section provides background information related to the present disclosure which is not necessarily prior art.

FIG. 1 shows an exemplary vertical semiconductor light emitting chip in the art.

The semiconductor light emitting device includes a growth substrate 10 (e.g., a sapphire substrate) and a stack of layers sequentially deposited on the growth substrate 10, including a buffer layer 20, a first semiconductor layer 30 having a first conductivity (e.g., an n-type GaN layer), an active layer 40 for generating light by electron-hole recombination (e.g., an InGaN/(In)/GaN plural quantum well (MQW) structure) and a second semiconductor layer 50 having a second conductivity different from the first conductivity (e.g., a p-type GaN layer). The semiconductor light emitting device further includes a light transmitting conductive film 60 for current spreading on the second semiconductor layer 50, an electrode 70 serving as a pad formed on the light transmitting conductive film 60, and an electrode 80 serving as a pad formed on an etched exposed portion of the first semiconductor layer 30 (e.g., a stack of Cr/Ni/Au metallic pads). This particular type of the semiconductor light emitting device as shown in FIG. 1 is called a lateral chip. Here, one side of the growth substrate 10 serves as a mounting face during electrical connections to an external substrate. In the context herein, the term "external substrate" to which a semiconductor light emitting chip or a semiconductor light emitting device is electrically connected refers to a PCB (Printed Circuit Board), a submount or a TFT (Thin Film Transistor).

FIG. 2 shows another exemplary semiconductor light emitting chip disclosed in U.S. Pat. No. 7,262,436. For convenience of description, similar components may be indicated by the same or different reference numerals and technical terms as appropriate.

The semiconductor light emitting chip includes a growth substrate 10 and a stack of layers sequentially deposited on the growth substrate 10, including a first semiconductor layer 30 having a first conductivity, an active layer 40 adapted to generate light by electron-hole recombination and a second semiconductor layer 50 having a second conductivity different from the first conductivity. Three-layered electrode films 90, 91 and 92 adapted to reflect light towards the growth substrate 10 are then formed on the second semiconductor layer 50. In particular, a first electrode film 90 can be a reflecting Ag film, a second electrode film 91 can be a Ni diffusion barrier and a third electrode film 93 can be an Au bonding film. Further, an electrode 80 serving as a bonding pad is formed on an etched exposed portion of the first semiconductor layer 30. Here, one side of the electrode film 29-2 serves as a mounting face during its electrical connections to an external substrate. This particular type of the semiconductor light emitting chip as shown in FIG. 2 is called a flip chip. In this flip chip of FIG. 2, the electrode 80 formed on the first semiconductor layer 30 is placed at a lower height level than the electrode films 90, 91 and 92 formed on the second semiconductor layer, but alternatively, it may be formed at the same height level as the electrode films. Here, height levels are given with respect to the growth substrate 10.

FIG. 3 shows another exemplary semiconductor light emitting chip disclosed in U.S. Pat. No. 8,008,683. For convenience of description, similar components may be indicated by the same or different reference numerals and technical terms as appropriate.

The semiconductor light emitting chip includes a stack of semiconductor layers sequentially deposited on a growth substrate, including a first semiconductor layer 30 having a first conductivity, an active layer 40 for generating light by electron-hole recombination and a second semiconductor layer 50 having a second conductivity different from the first conductivity; an upper electrode 36 formed on a side free of the growth substrate; a supporting substrate 51 for supporting the semiconductor layers 30, 40 and 50 while supplying current to the second semiconductor layer 50; and a lower electrode 52 formed on the supporting substrate 51. The upper electrode 31 is electrically connected to an external substrate by wire bonding. One side of the lower electrode 52 serves as a mounting face during its electrical connections to the external substrate. The semiconductor light emitting chip as shown in FIG. 3 corresponds to a vertical chip where the electrodes 31 and 52 are disposed above and below the active layer 40, respectively.

FIG. 4 shows another example of a semiconductor light emitting device in the prior art.

The semiconductor light emitting device 100 has lead frames 110 and 120, a mold 130 and a vertical-type light emitting chip 150 in a cavity 140 which is filled with an encapsulation member 170 containing a wavelength converting material 160. The lower surface of the vertical-type light emitting chip 150 is directly electrically connected to the lead frame 110 and the upper surface thereof is electrically connected to the lead frame 120 by a wire 180. A portion of the light coming out of the vertical-type light emitting chip 150 excites the wavelength converting material 160 such that lights of different colors are generated and white light is produced by mixing two different lights. For instance, blue light is generated by the semiconductor light emitting chip 150 and yellow light is generated by the wavelength converting material 160 when it is excited. Then these blue and yellow lights can be mixed to produce white light. Alternatively, while the semiconductor light emitting device shown in FIG. 4 includes the vertical-type light emitting chip 150 as shown in FIG. 3, it may also be obtained utilizing the semiconductor light emitting chips as illustrated in FIG. 1 and FIG. 2.

FIG. 5 shows an LED display described in Japanese patent application laid-open No. 1995-288341. For convenience of description, similar components may be indicated by the same or different reference numerals and technical terms as appropriate.

FIG. 5 is a top view 190 showing a pixel structure of the LED display. In the pixel structure, semiconductor light emitting chips 194, 195 and 196 are electrically connected to conductor layers 191 formed on the PCB. The semiconductor light emitting chip 194 that emits blue light is a lateral chip, which is electrically connected to the conductor layer 191 by wire bonding and is attached onto the conductor layer 191 by the insulating adhesive 193. Meanwhile, the semiconductor light emitting chips 195 and 196 that emit green and red lights, respectively, are vertical chips, which are electrically connected to the conductor layer 191 by wire bonding and by a conductive adhesive 197. These semiconductor light emitting chips are enveloped by a cover member 192, separating them from their neighboring chips. Although not shown, an encapsulation member may be employed to cover the semiconductor light emitting chips 194, 195 and 196 for protection.

As shown in FIG. 5, in the construction of pixels, semiconductor light emitting chips are directly connected onto the PCB and each pixel is separated from its adjacent pixels by the cover and encapsulation members. This direct connection of semiconductor light emitting chips onto the PCB for pixel construction is not a simple process and when any of the pixels has a problem, a semiconductor light emitting chip associated with the pixel also needs to be separated from the PCB. In particular, when a light source in a display device involves micro semiconductor light emitting chips having a maximum width of 150 μm or less, preferably 100 μm or less, as measured on a plane, it is much more difficult to separate only this tiny micro semiconductor light emitting chip of a corresponding pixel from the PCB.

Further, it is typical that semiconductor light emitting chips go through defect inspections and an inspection system should be connected to an electrode of each chip. However, each micro semiconductor light emitting chip also has a very small electrode, which causes the inspections to be conducted only after the chip is installed on the display device, instead of during the manufacturing process of semiconductor light emitting chips. This leads to increased manufacturing costs.

Accordingly, the present disclosure is directed to provide a micro light emitting device in which pixels are constructed with micro semiconductor light emitting chips. In other words, it is directed to provide a micro light emitting device that is smaller than a pixel in an LED display. When such an ultra-small semiconductor light emitting device of the present disclosure is connected to a PCB for example, it is possible to remove the device if it is part of a defective pixel such that the overall manufacturing process of an LED display is facilitated. In addition, this device with micro semiconductor light emitting chips has an electrode that is large enough for defect inspections to be conducted thereon. That is, micro semiconductor light emitting chips undergo emission inspections before they are installed on the display device, facilitating the overall manufacturing process.

SUMMARY

Objects and features of the present disclosure will be explained in further detail below.

This section provides a general summary of the disclosure and is not a comprehensive disclosure of its full scope or all of its features.

According to one aspect of the present disclosure, there is provided a semiconductor light emitting device comprising: one or more light emitting units, each including a first semiconductor layer having a first conductivity, an active layer for generating light by electron-hole recombination, and a second semiconductor layer having a second conductivity different from the first conductivity, with the first semiconductor layer, the active layer and the second semiconductor layer being sequentially formed on a growth substrate; an electrode unit including a first semiconductor layer having a first conductivity and a metal layer formed on the first semiconductor layer; and one or more bonding layers for electrically connecting to the light emitting units and electrode unit, respectively, wherein each bonding layer has a first region on which the light emitting units and the electrode unit are arranged, and a second region having a larger planar area than that of the first region and being electrically connected to an external substrate.

According to another aspect of the present disclosure, there is provided a method for manufacturing a semiconductor light emitting device, the method comprising: forming, on a growth substrate, plural light emitting units and an electrode unit, in which each of the light emitting units includes a first semiconductor layer having a first conductivity, an active layer for generating light by electron-hole recombination, and a second semiconductor layer having a second conductivity different from the first conductivity, and the electrode unit includes a first semiconductor layer and a metal layer; forming plural bonding layers on a sacrificial substrate; electrically connecting the plural light emitting units and electrode unit to their corresponding bonding layers, respectively; removing the growth substrate; forming an encapsulating layer for covering the plural light emitting units, the electrode unit and the bonding layers, with the first semiconductor layers of the light emitting units and electrode unit being exposed from the encapsulating layer; forming a transparent electrode layer for covering the encapsulating layer as well as at least portions of the first semiconductor layers of the light emitting units and electrode unit exposed from the encapsulating layer; forming an opaque layer in such a way that upper surfaces of the plural light emitting units and electrode unit are exposed; and forming a light-transmitting protective layer for covering the opaque layer.

These and other advantages of the present invention will be recognized by those of skill in the art in view of the following detailed description, the accompanying drawings and the appended claims.

BRIEF DESCRIPTION OF THE DRAWINGS

FIG. 12 illustrates an exemplary method for manufacturing plural bonding layers on a sacrificial substrate, according to the present disclosure.

DETAILED DESCRIPTION OF THE PREFERRED EMBODIMENTS

The present disclosure will now be described in detail with reference to the accompanying drawing(s).

Figure 1:
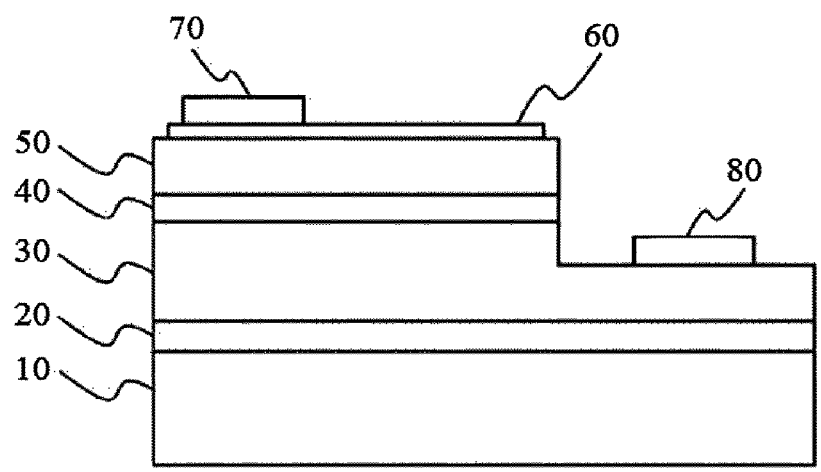
FIG. 1 shows an exemplary vertical semiconductor light emitting chip in the art.
Figure 2:
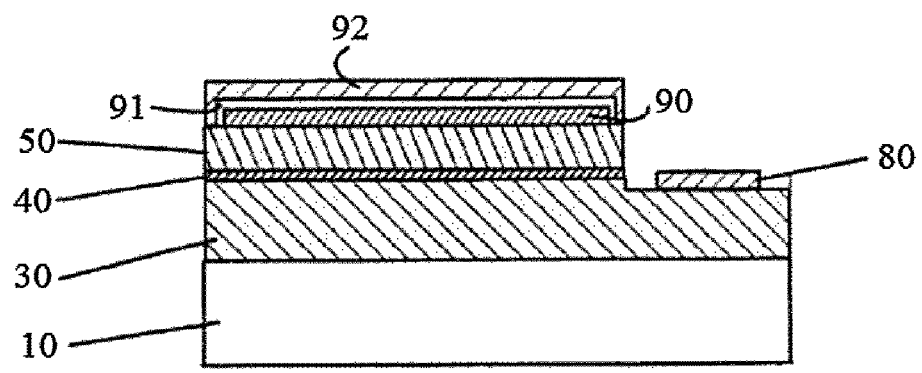
FIG. 2 shows another exemplary semiconductor light emitting chip disclosed in U.S. Pat. No. 7,262,436.
Figure 3:
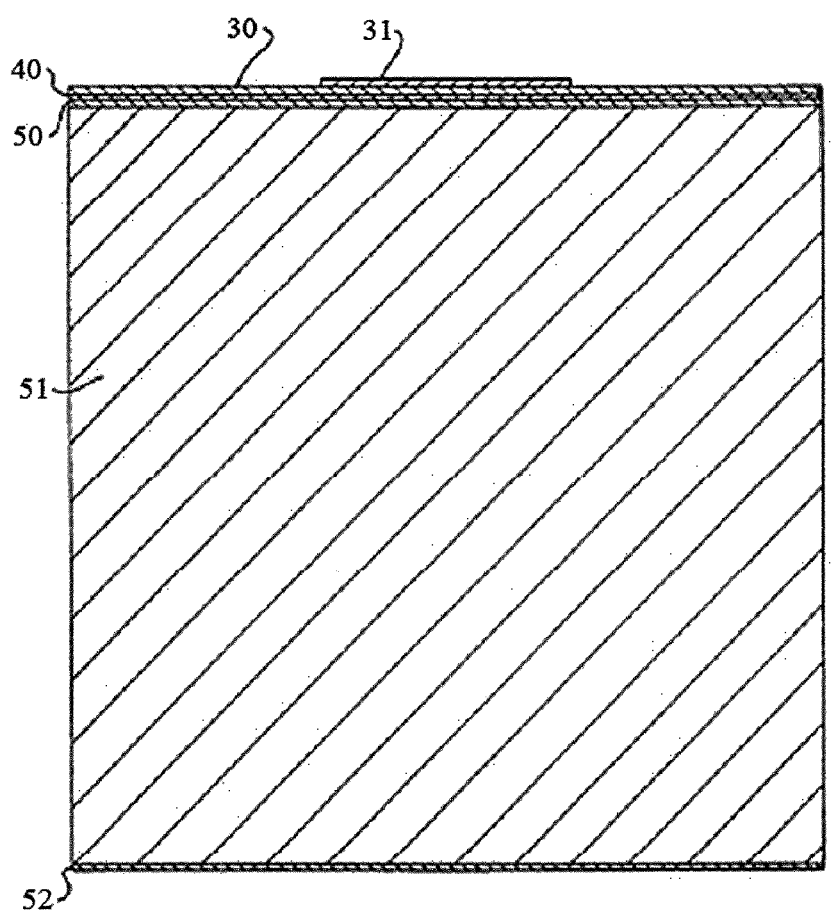
FIG. 3 shows another exemplary semiconductor light emitting chip disclosed in U.S. Pat. No. 8,008,683.
Figure 4:
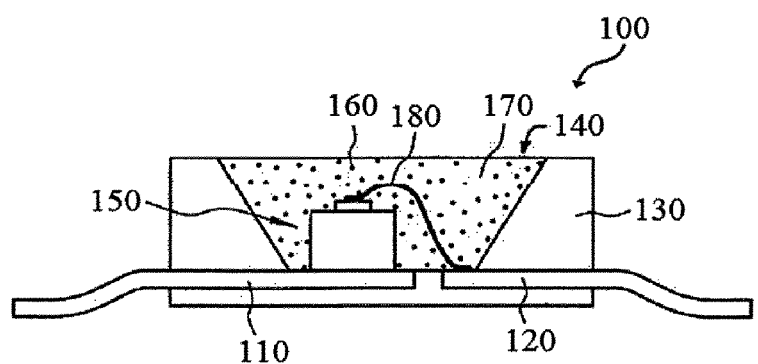
FIG. 4 shows another example of a semiconductor light emitting device in the prior art.
Figure 5:
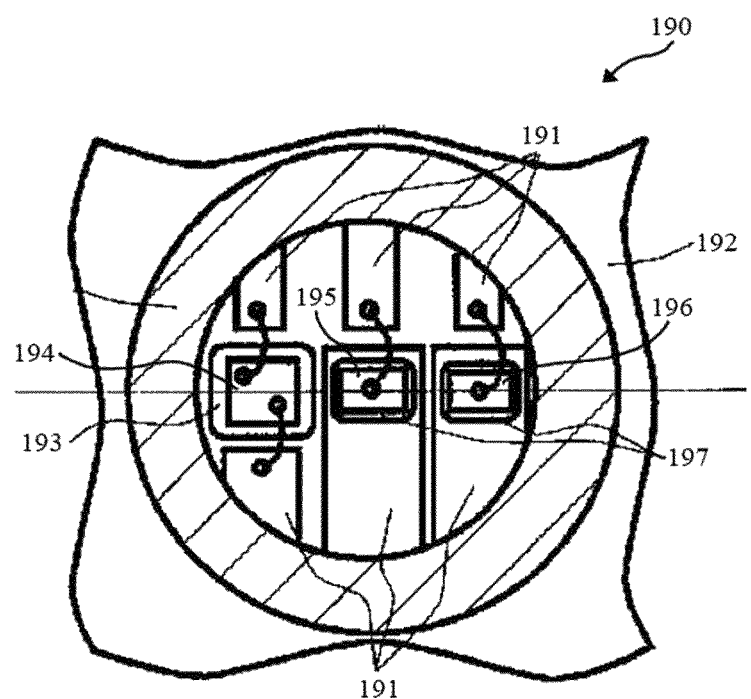
FIG. 5 shows an LED display described in Japanese patent application laid-open No. 1995-288341.
Figure 6:
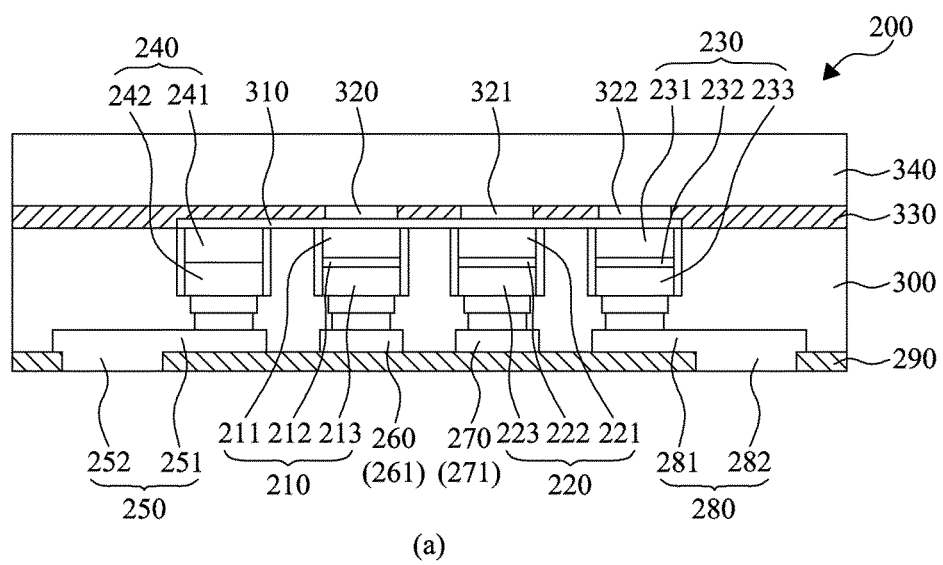
FIG. 6 shows an exemplary semiconductor light emitting device according to the present disclosure.
Figure 6:
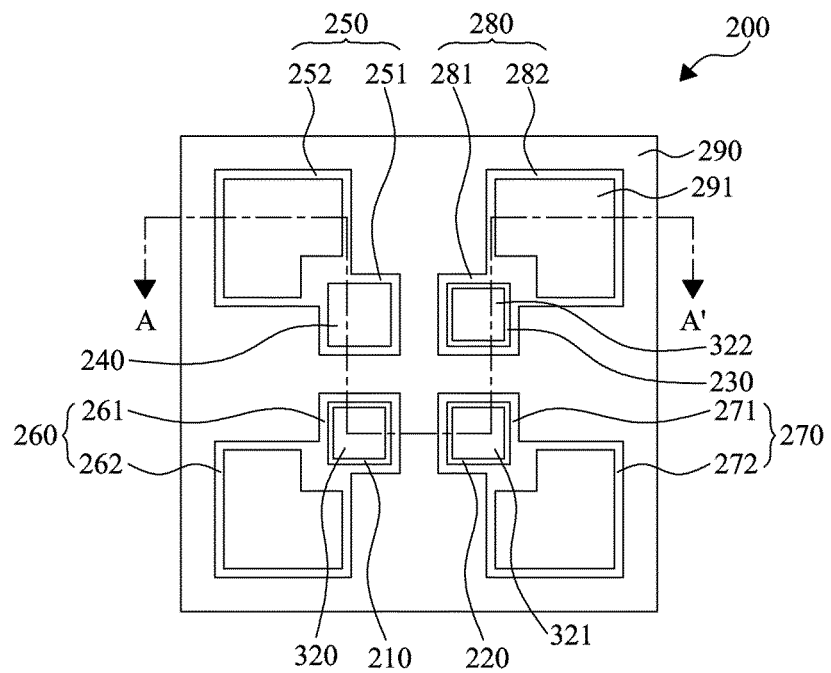

FIG. 6 shows an exemplary semiconductor light emitting device 200 according to the present disclosure.

FIG. 6A is a cross sectional view taken along A-A' and FIG. 6B is a bottom view in which some parts that are normally hidden from view are also included to describe the internal structure of a semiconductor light emitting device according to the present disclosure.

The semiconductor light emitting device 200 comprises: one or more light emitting units 210, 220 and 230, including a first semiconductor layers 211, 221 and 231 having a first conductivity, active layers 212, 222 and 232 for generating light by electro-hole recombination and second semiconductor layers 212, 223 and 233 having a second conductivity different from the first conductivity, respectively; an electrode unit 240 including a first substrate layer 241 having a first conductivity and a metal layer 242; and one or more bonding layers 250, 260, 270 and 280 being electrically connected to the light emitting units 210, 220 and 230 and electrode unit 240, respectively.

Each of the bonding layers 250, 260, 270 and 280 can have a first region 251, 261, 271 or 281 on which the electrode unit 240 and the light emitting unit 210, 220 or 230 are positioned; and a second region 252, 262, 272 or 282 having a larger planar area than that of the first region 251, 261, 271 or 281 and being electrically connected to an external substrate. Each of the bonding layers 250, 260, 270 and 280 may be formed of gold (Au) or a stack of one or more metals (e.g., Cr/Ni/Au). If the light emitting unit 210, 220 or 230 has a planar area corresponding to a micro semiconductor light emitting chip, it will be difficult to inspect or test emission properties of each light emitting unit due to its small size. However, the second regions 252, 262, 272 and 282 of the bonding layers 250, 260, 270 and 280 that have a larger planar area than that of the first regions and are electrically connected to an external substrate allow emission inspections on each of the light emitting units 210, 220 and 230 connected to the bonding layers 250, 260, 270 and 280, such that emission defects in the semiconductor light emitting device 200 which uses these light emitting units 210, 220 and 230 having a size corresponding to a micro semiconductor light emitting chip can be readily inspected before the semiconductor light emitting device 200 is installed on a display device.

The device may further include an insulation layer 290 below the bonding layers 250, 260, 270 and 280. This insulation layer 290 may be made of an insulating material. For example, it may be made of at least one of silicon dioxide ($SiO_2$), aluminum oxide ($Al_2O_3$), silicon nitride or polyimide. A portion of each of the second regions 252, 262, 272 and 282 in the bonding layers is preferably exposed from the insulation layer 290 to be electrically connected to an external substrate. For example, the insulation layer 290 may have a hole 291 on which each of the second regions 252, 262, 272 and 282 of the bonding layers can be formed, occupying a larger planar area than the hole 291.

The semiconductor light emitting device 200 may further include an encapsulating layer 300 that covers the insulation layer 290, the light emitting units 210, 220 and 230, the electrode unit 240 and the bonding layers 250, 260, 270 and 280. The encapsulating layer 300 may be made of a light transmitting or opaque (i.e. non-transmissive) material. Preferably, the first semiconductor layers 211, 221, 231 and 241 of the light emitting units 210, 220 and 230 and electrode unit 240 are exposed from the encapsulating layer 300.

The semiconductor light emitting device 200 may further include an encapsulating layer 300 and a transparent electrode layer 310 that covers at least portions of the first semiconductor layers 211, 221, 231 and 241 of the light emitting units and electrode unit exposed from the encapsulating layer 300.

As described above, when a first light emitting unit 210, a second light emitting unit 220 and a third light emitting unit 230 are present, there may be bonding layers for each, i.e. a first bonding layer 260 corresponding to the first light emitting unit 210, a second bonding layer 270 corresponding to the second light emitting unit 220, a third bonding layer 280 corresponding to the third light emitting unit 230 and a fourth bonding layer 250 corresponding to the electrode unit 240. These plural light emitting units can be controlled, through the transparent electrode 310 that is electrically connected to the light emitting units 210, 220 and 230 and electrode unit 240 and through the bonding layers 250, 260, 270 and 280 that are electrically connected to an external substrate. That is, if current is supplied to the first bonding layer 260 corresponding to the first light emitting unit 210, but not the second and third bonding layers 270 and 280 corresponding to the second and third light emitting units 220 and 230, the current supplied to the first bonding layer 250 will pass the first light emitting unit 210 and the transparent electrode layer 310 through the electrode unit 240, allowing only the first light emitting unit 210 to emit light. The same principle can be applied to the second and third light emitting units 220 and 230 to allow them to emit light separately or together at the same time.

RGB semiconductor light emitting devices can be obtained by causing the first light emitting unit 210 to emit red light, the second light emitting unit 220 to emit green light and the third light emitting unit 230 to emit blue light, respectively. Alternatively, RGB semiconductor light emitting devices can be obtained, in which the light emitting units 210, 220 and 230 emit lights of one color (e.g., blue) or ultraviolet lights. In this case, as shown in FIG. 6 for example, RGB semiconductor light emitting devices can be obtained by forming color coating layers 320, 321 and 322 showing different colors, on an upper surface of the transparent electrode layer 310 corresponding to the first, second and third light emitting units 210, 220 and 230, respectively. These color coating layers 320, 321 and 322 may be formed of quantum dots.

When the semiconductor light emitting device 200 is an RGB semiconductor light emitting device emitting lights of different colors, it may further include an opaque layer 330 for covering the transparent electrode layer 310 in order to minimize interference between lights of different colors. On the other hand, the color coating layers 320, 321 and 322 are preferably exposed from the opaque layer 330, allowing the light to go through.

The semiconductor light emitting device 200 may further include a light-transmitting protective layer 340 to protect the surface of the device 200. The protective layer 340 can be directly formed on the opaque layer 330 if present or it can be directly formed on the transparent electrode layer 310 if the opaque layer 330 is not present.

Figure 7:
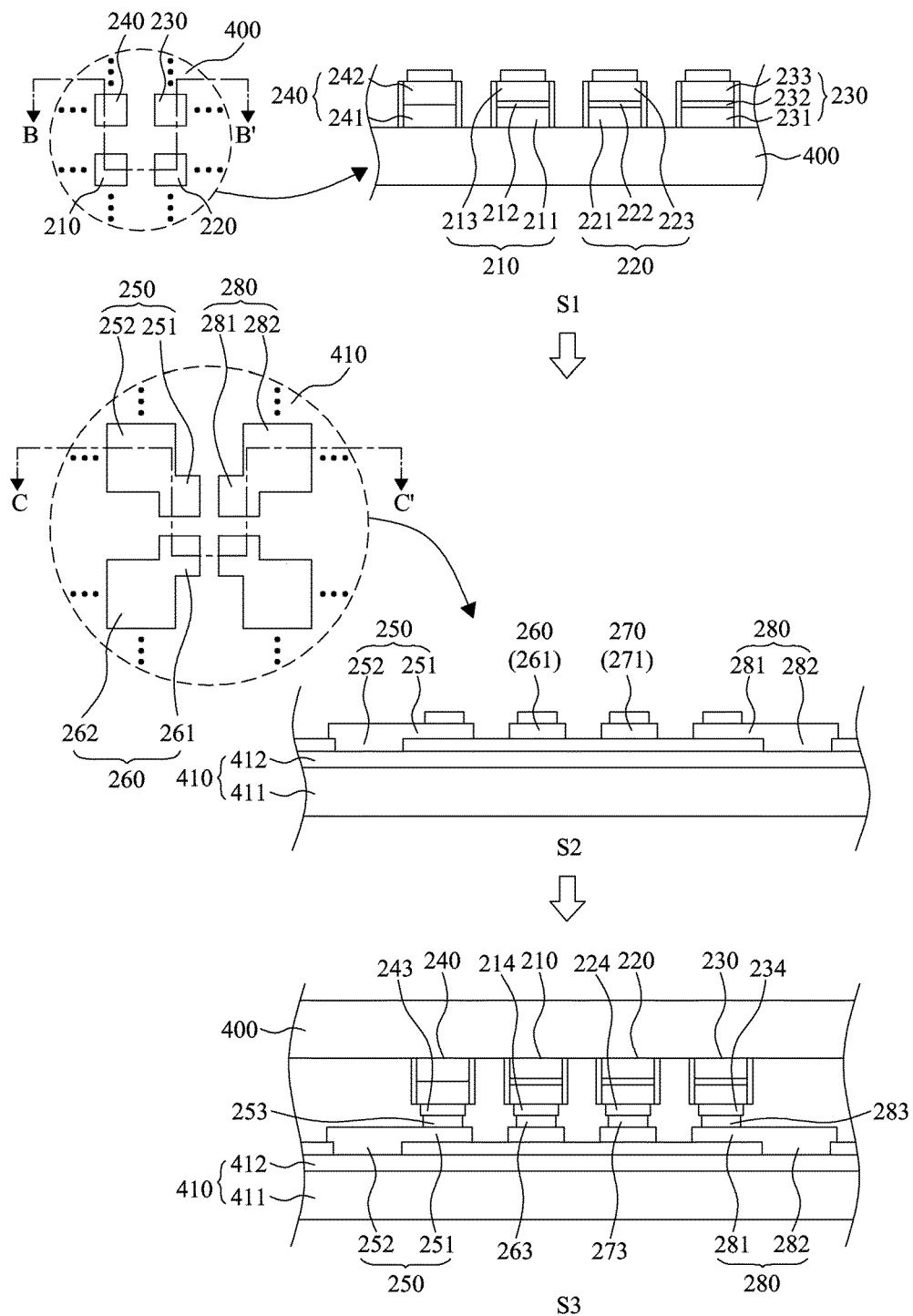
FIGS. 7, 8 and 9 illustrate an exemplary method for manufacturing a semiconductor light emitting device according to the present disclosure.
Figure 8:
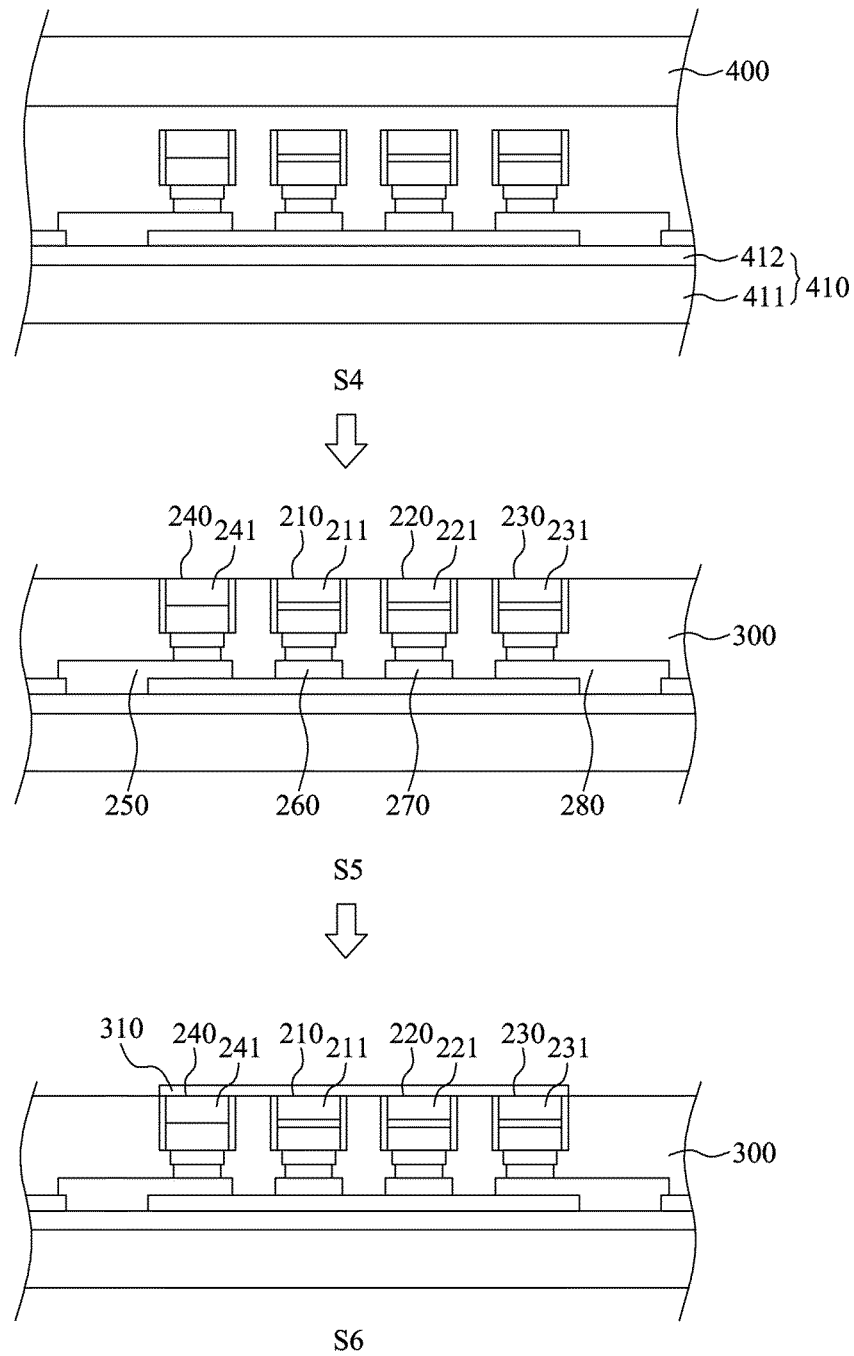
Figure 9:
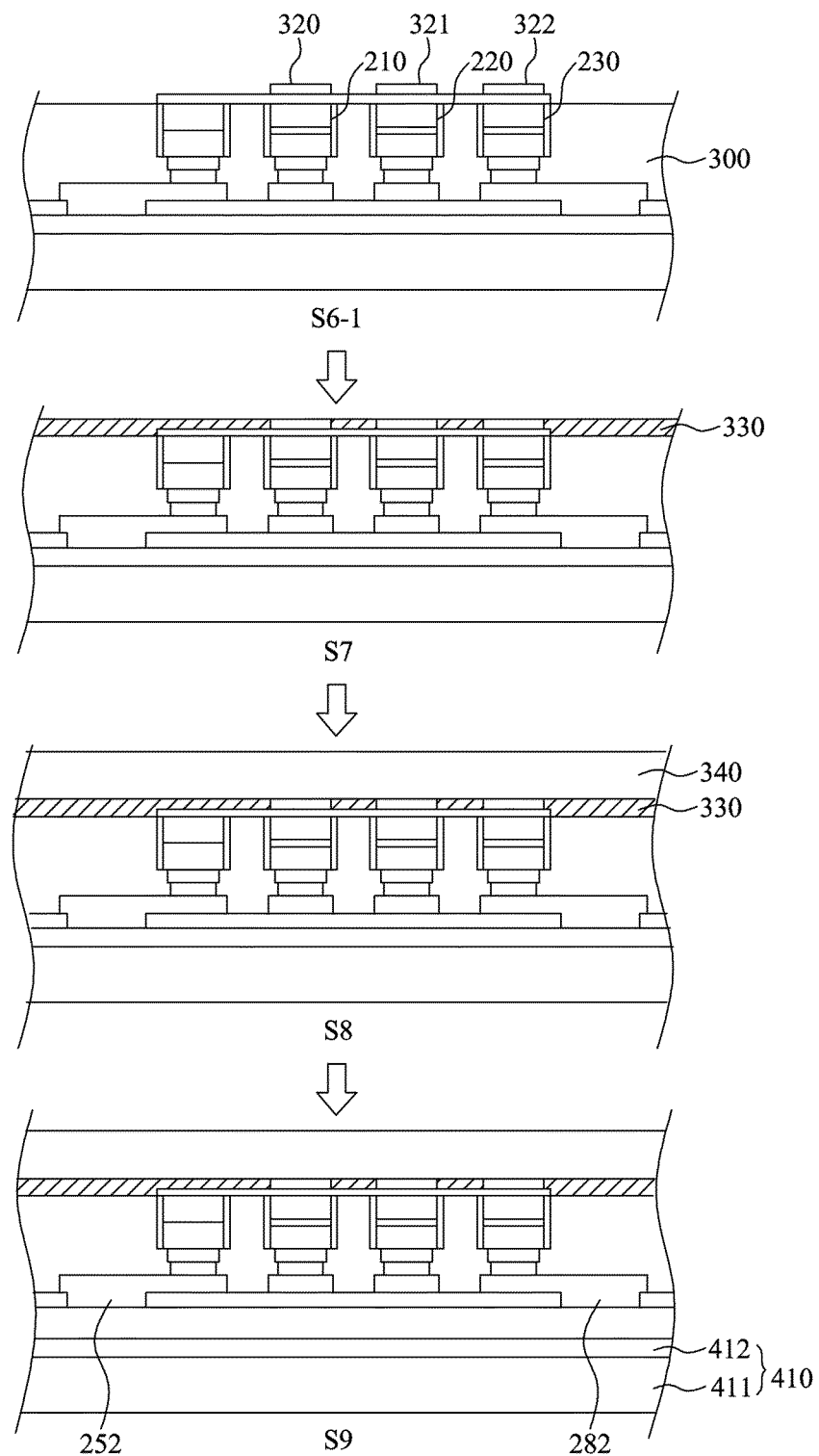

FIGS. 7-9 illustrate an exemplary method for manufacturing a semiconductor light emitting device according to the present disclosure.

In S1, a growth substrate 400 is prepared, in which the growth substrate 400 includes: plural light emitting units 210, 220 and 230, each including a first semiconductor layer 211, 221 or 231 having a first conductivity, an active layer 212, 222 or 232 for generating light by electron-hole recombination and a second semiconductor layer 213, 223 or 233 having a second conductivity different form the first conductivity; and an electrode unit 240 including a first semiconductor layer 241 and a metal layer 242. For better description, a cross-sectional view taken along line B-B' of a dotted circle is shown in S1. The process of forming the plural light emitting units 210, 220 and 230 and the electrode unit 240 on the growth substrate 400 will be further explained with reference to FIGS. 10 and 11. Next in S2, a sacrificial substrate 410 including plural bonding layers 250, 260, 270 and 280 is prepared. For better description, a cross-sectional view taken along line C-C' of a dotted circle is shown in S2. The sacrificial substrate 410 is obtained by forming a sacrificial layer 412 on a light-transmitting support substrate 411 (e.g., a glass or sapphire substrate). The sacrificial layer 412 may be made of a material exhibiting lower adhesion by laser light (e.g., GaN, $SiO_2$, SiN, an epoxy resin, etc.). Each of the bonding layers 250, 260, 270 and 280 has a first region 251, 261, 271 or 281 on which the electrode unit 240 and the light emitting unit 210, 220 or 230 are positioned; and a second region 252, 262, 272 or 282 having a larger planar area than that of the first region 251, 261, 271 or 281 and being electrically connected to an external substrate. The process of forming the bonding layers 250, 260, 270 and 280 will be further explain with reference to FIG. 12. These S1 and S2 steps may be carried out separately in any order. Referring now to S3, the light emitting units 210, 220 and 230 and electrode unit 240 are electrically connected respectively to their corresponding bonding layers 250, 260, 270 and 280 of the first region 251, 261, 271 and 281. To facilitate electrical connections, the light emitting units 210, 220 and 230 and electrode unit 240 include pad electrodes 214, 224, 234 and 243, respectively and a solder ball 253, 263, 273 or 283 (e.g., SAC) is provided on an upper surface of each of the bonding layers 250, 260, 270 or 280 such that the pad electrodes 214, 224, 234 and 243 and the solder balls 253, 263, 273 and 283 may be in contact with each other and are electrically connected. In S4, the growth substrate 400 is then removed. When the growth substrate 400 is a light-transmitting sapphire substrate, it can be removed by laser lift-off (LLO). On the other hand, when the growth substrate 400 is non-transmissive, it can be removed by chemical lift-off (CLO). In S5, an encapsulating layer 300 for covering the light emitting units 210, 220 and 230, the electrode unit 240 and the bonding layers 250, 260, 270 and 280 is formed. In particular, the encapsulating layer 300 is formed in such a way that the first semiconductor layers 211, 221, 231 and 241 of the light emitting units 210, 220 and 230 and electrode unit 240 are exposed from the encapsulating layer 300. Preferably, the encapsulating layer 300 has a thickness of 5 μm to 10 μm as it should be thicker than a total thickness of the epitaxial (Epi) layer and solder ball. The encapsulating layer 300 may be formed by coating, for example, at least one of light-transmitting materials (e.g., polyimide, an epoxy resin, etc.) or opaque materials (e.g., any material used in the black matrix of LCDs). The upper surface of the encapsulating layer 300 is preferably flat for subsequent processes. In S6, a transparent electrode layer 310 that covers the encapsulating layer 300 as well as at least portions of the first semiconductor layers 211, 221, 231 and 241 of the light emitting units 210, 220 and 230 and electrode unit 240 exposed from the encapsulating layer 300 is formed. The transparent electrode layer 310 can be made of an indium tin oxide (ITO), transparent conductive oxide (TCO) or thin metal film. Preferably, the transparent electrode layer 310 has a thickness of 50 nm to 300 nm, taking transmittance and electrical conductivity into consideration. In S6-1, color coating layers 320, 321 and 322 of different colors are formed on the upper surfaces of the light emitting units 210, 220 and 230. For example, these color coating layers may have red 320, green 321 and blue 322, respectively. Preferably, the color coating layers have a thickness of 10 μm to 50 μm. The semiconductor light emitting units 210, 220 and 230 having the color coating layers 320, 321 and 322 present thereon preferably emit ultraviolet lights. The color coating layers 320, 321 and 322 can be formed of quantum dots (QD). In an alternative example, the color coating layers may be omitted if the light emitting units 210, 220 and 230 directly emit red, green and blue lights. In S7, an opaque layer 330 is formed in such a way that light may come through the upper surfaces of the light emitting units 210, 220 and 230. Preferably, the opaque layer 330 has a thickness of 10 μm to 50 μm. On one hand, if the color coating layers 320, 321 and 322 in S6-1 are absent, forming the opaque layer 330 in such a way to allow light to come through the upper surfaces of the light emitting units 210, 220 and 230 is attained by exposing the upper surfaces of the light emitting units 210, 220 and 230 from the opaque layer 330. On the other hand, if the color coating layers 320, 321 and 322 in S6-1 are present, the upper surface of the color coating layers 320, 321 and 322 are exposed from the opaque layer 330. In S8, a light-transmitting protective layer 340 for covering the opaque layer 330 is formed. Preferably, the light-transmitting protective layer 330 has a thickness of 10 μm to 1 mm. The light-transmitting protective layer 330 may be formed by coating or by attaching with an adhesive, glass, a transparent resin, a sapphire substrate or a transparent film. In S9, the sacrificial substrate 410 is removed such that the second regions 252, 262, 272 and 282 of the bonding layers 250, 260, 270 and 280 are exposed to outside. In the sacrificial substrate 410, the light-transmitting support substrate 411 is removed in a similar way as the growth substrate 400 and the sacrificial layer 423 is removed using ICP or chemical substances. Lastly, although not shown, individual semiconductor light emitting devices are obtained by cutting. For example, the semiconductor light emitting units and electrode unit grown on the growth substrate are cut into squares as shown in FIG. 6. That is, multiple semiconductor light emitting devices are produced from one growth substrate, according to the present disclosure.

Figure 10:
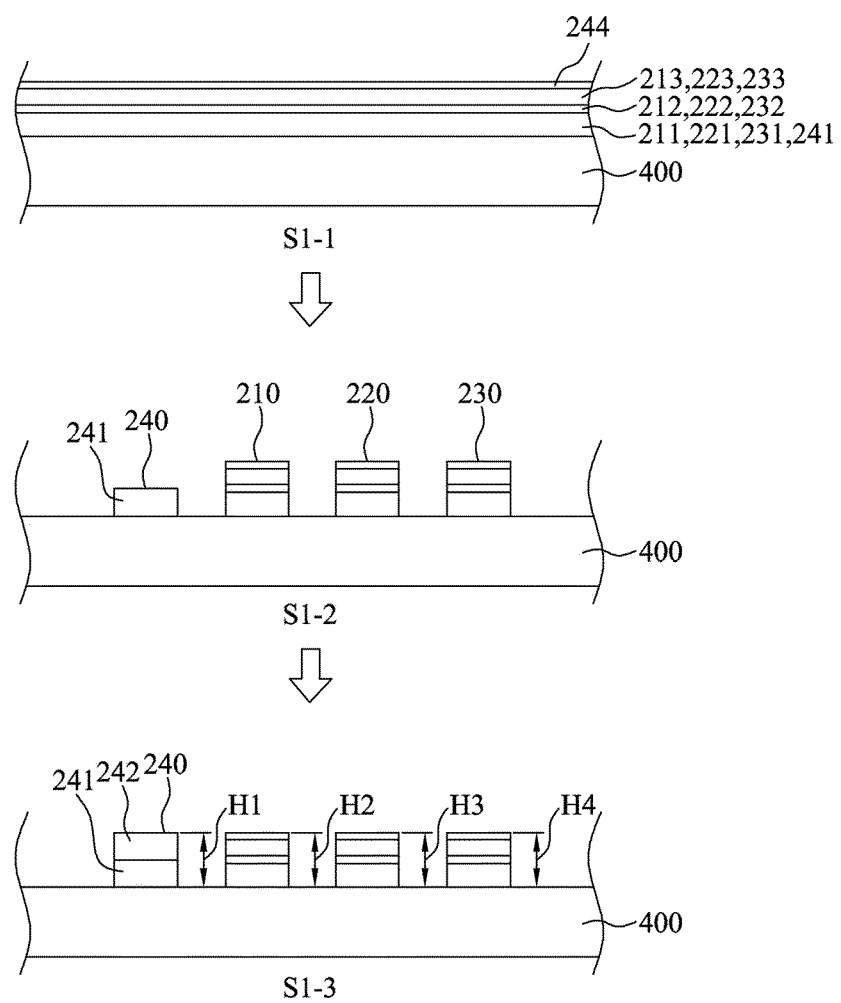
FIGS. 10 and 11 illustrate an exemplary method for forming, on a growth substrate, plural light emitting units, a first semiconductor layer and a metal layer, according to the present disclosure.
Figure 11:
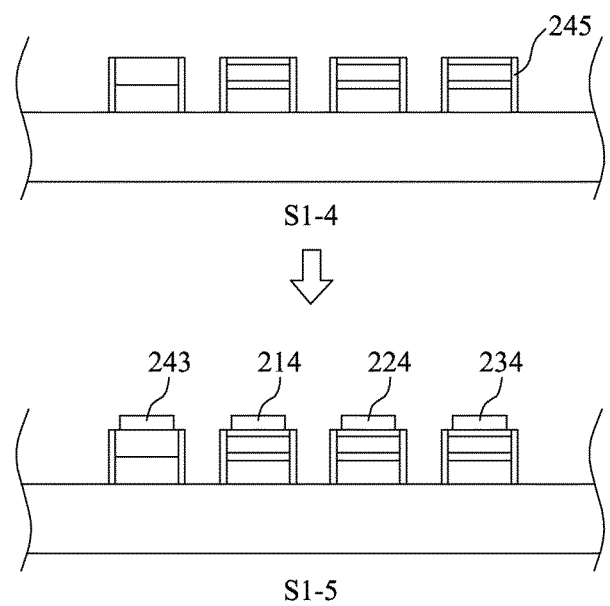

FIGS. 10 and 11 illustrate an exemplary method for forming, on a growth substrate 400, plural light emitting units, a first semiconductor layer and a metal layer, according to the present disclosure.

The method illustrated in FIGS. 10 and 11 is referred to a cross-sectional view taken along line B-B' of the dotted circle in FIG. 7.

In S1-1, a first semiconductor layer 211, 221, 231 or 241, an active layer 212, 222 or 232 and a second semiconductor layer 213, 223 or 233 are sequentially formed on the growth substrate 400. The growth substrate 200 may be made of a material such as sapphire ($Al_2O_3$), SiC or GaAs, for example and any materials that can grow semiconductors may be used without particular limitation. Unless specified otherwise, a semiconductor as used herein refers to a group III nitride semiconductor and the growth substrate 400 refers to a light-transmitting sapphire substrate. An n-type semiconductor layer (Si-doped GaN) as the first semiconductor layer 211, 221 or 231, a p-type semiconductor layer (Mg-doped GaN) as the second semiconductor layer 213, 223 or 233 and the active layer (e.g., an InGaN/(In)/GaN multiple quantum well (MQW)) may be included. For red light emission, an AlGaInP-based active layer 212, 222 or 233 may be grown. The semiconductor layers are not particularly limited provided that they employ a PN junction and emit light by recombination of electrons and holes. The semiconductor layers may be grown by deposition such as MOCVD. Although not shown, a buffer layer or a seed layer (e.g., AlN) for stable growth of a semiconductor may be formed on the growth substrate 400 before the semiconductor layers are formed thereon. Moreover, a transparent electrode 244 (e.g., ITO) may be formed on the second semiconductor layer 213, 223 or 233. Next, in S1-2, the semiconductor layers are mesa-etched to form plural light emitting units 210, 220 and 230 and a first semiconductor layer 242 of the electrode unit 240. In S1-3, a metal layer 242 is deposited on the first semiconductor layer 241 of the electrode unit 240. The metal layer 242 is preferably made of copper (Cu). Preferably, the metal layer 242 is deposited so that height H1 of the electrode unit 240 is equal to heights H2, H3 and H4 of the light emitting parts 210, 220 and 230. The height H1 of the electrode unit 240 and the heights H2, H3 and H4 of the light emitting units 210, 220 and 230 are approximately 10 μm or less. Moreover, instead of being directly deposited on the growth substrate 400, the metal layer 242 is deposited on the first semiconductor layer 241 to facilitate its deposition, thereby forming an N-ohmic contact electrode. Next, in S1-4, an insulation layer 245 for surrounding lateral surfaces of each of the light emitting units 210, 220 and 230 and of the electrode unit 240 is formed. The insulation layer 245 can be formed by depositing $SiO_2$, $Al_2O_3$, silicon nitride, polyimide or the like. In S1-5, pad electrodes 214, 224, 234 and 243 are formed on the upper surfaces of the light emitting units 210, 220 and 230 and electrode unit 240, respectively. These pad electrodes 214, 224, 234 and 243 are preferably made of copper (Cu).

FIG. 12 illustrates an exemplary method for manufacturing plural bonding layers on a sacrificial substrate, according to the present disclosure.

The method illustrated in FIG. 12 is referred to a cross-sectional view taken along line C-C' of the dotted circle in FIG. 7.

First, in S2-1, a sacrificial substrate 410 is prepared by forming a sacrificial layer 412 on a light-transmitting support substrate 411. The sacrificial layer 412 can be formed by coating or deposition. In S2-2, an insulation layer 290 is formed on the sacrificial layer 412. In particular, to form the insulation layer 290, an insulating material is either coated or deposited on the sacrificial layer 412, and a portion of it is etched to form a hole 291 exposing the sacrificial layer 412 therethrough. Next, in S2-3, bonding layers 250, 260, 270 and 280 are formed on the insulation layer 290. These bonding layers 250, 260, 270 and 280 can be formed by depositing a metal material (e.g. Cu). The bonding layers 250, 260, 270 and 280 can each be divided into a first region 252 and 281 formed on the insulation layer 290 and a second region 252 and 282 formed in a corresponding hole 291 through which the sacrificial layer 412 is exposed. As an alternative, the bonding layers 250, 260, 270 and 280 may be directly formed on the sacrificial layer 412 without the insulation layer 290. In this case, the first and second regions of the bonding layers 250, 260, 270 and 280 can be distinguished by their plane dimensions and positions. For example, referring back to FIG. 7, in the bonding layers 250, 260, 270 and 280, the first regions 251, 261, 271 and 281 are larger than the second regions 252, 262, 272 and 282, with the second regions being located outside of the first regions. If needed, in S2-4, solder balls 253, 263, 273 and 283 can be formed on the first regions 251, 261, 271 and 281 of the corresponding bonding layers 250, 260, 270 and 280.

The below are various exemplary embodiments of the disclosure.

(1) A semiconductor light emitting device comprising: one or more light emitting units, each including a first semiconductor layer having a first conductivity, an active layer for generating light by electron-hole recombination, and a second semiconductor layer having a second conductivity different from the first conductivity, with the first semiconductor layer, the active layer and the second semiconductor layer being sequentially formed on a growth substrate; an electrode unit including a first semiconductor layer having a first conductivity and a metal layer formed on the first semiconductor layer; and one or more bonding layers for electrically connecting the light emitting units and electrode unit, respectively, wherein each bonding layer has a first region on which the light emitting units and the electrode unit are arranged, and a second region having a larger planar area than that of the first region and being electrically connected to an external substrate.

(2) There is also provided the semiconductor light emitting device of (1), further comprising: an insulation layer arranged below the first region of the bonding layer, wherein at least a portion of the second region is exposed from the insulation layer.

(3) There is also provided the semiconductor light emitting device of (2), wherein the light emitting units include a first light emitting unit, a second light emitting unit and a third light emitting unit, and the bonding layers include a first bonding layer corresponding to the first light emitting unit, a second bonding layer corresponding to the second light emitting unit, a third bonding layer corresponding to the third light emitting unit, and a fourth bonding layer corresponding to the electrode unit.

(4) There is also provided the semiconductor light emitting device of (3), further comprising: an encapsulating layer for covering the insulation layer, light emitting units and bonding layers, wherein the first semiconductor layers of the light emitting units and electrode unit are exposed from the encapsulating layer.

(5) There is also provided the semiconductor light emitting device of (4), further comprising: a transparent electrode layer for covering the encapsulating layer as well as at least portions of the first semiconductor layers of the light emitting units and electrode unit exposed from the encapsulating layer.

(6) There is also provided the semiconductor light emitting device of (5), wherein the first, second and third light emitting units emit lights of different colors.

(7) There is also provided the semiconductor light emitting device of (5), further comprising: color coating layers showing different colors, formed on an upper surface of the transparent electrode layer corresponding to the first, second and third light emitting units, respectively.

(8) There is also provided the semiconductor light emitting device of (7), further comprising: an opaque layer for covering the transparent electrode layer, wherein the color coating layers are exposed from the opaque layer.

(9) There is also provided the semiconductor light emitting device of (8), further comprising: a light-transmitting protective layer for covering the opaque layer.

(10) A method for manufacturing a semiconductor light emitting device, the method comprising: forming, on a growth substrate, plural light emitting units and an electrode unit, in which each of the light emitting units includes a first semiconductor layer having a first conductivity, an active layer for generating light by electron-hole recombination, and a second semiconductor layer having a second conductivity different from the first conductivity, and the electrode unit includes a first semiconductor layer and a metal layer; forming plural bonding layers on a sacrificial substrate; electrically connecting the plural light emitting units and electrode unit to their corresponding bonding layers, respectively; removing the growth substrate; forming an encapsulating layer for covering the plural light emitting units, the electrode unit and the bonding layers, with the first semiconductor layers of the light emitting units and electrode unit being exposed from the encapsulating layer; forming a transparent electrode layer for covering the encapsulating layer as well as at least portions of the first semiconductor layers of the light emitting units and electrode unit exposed from the encapsulating layer; forming an opaque layer in such a way that upper surfaces of the plural light emitting units and electrode unit are exposed; and forming a light-transmitting protective layer for covering the opaque layer.

(11) There is also provided the method for manufacturing a semiconductor light emitting device of (10), wherein forming, on a growth substrate, plural light emitting units and an electrode unit, includes: sequentially forming, on a growth substrate, a first semiconductor layer having a first conductivity, an active layer for generating light by electron-hole recombination, and a second semiconductor layer having a second conductivity different from the first conductivity; forming plural light emitting units; and forming an electrode unit by selecting one of the light emitting units, and forming a metal layer on the first semiconductor layer that is left after the second semiconductor layer and the active layer are removed.

(12) There is also provided the method for manufacturing a semiconductor light emitting device of (11), further comprising: after forming a metal layer on the first semiconductor layer that is left after the second semiconductor layer and the active layer are removed, forming an insulation layer on lateral surfaces of the plural light emitting units and of the electrode unit; and forming pad electrodes electrically connected to the second semiconductor of each of the light emitting units and to the metal layer of the electrode unit.

(13) There is also provided the method for manufacturing a semiconductor light emitting device of (10), wherein forming plural bonding layers on a sacrificial substrate includes: forming an insulation layer on the sacrificial substrate; exposing a portion of the sacrificial substrate from the insulation layer; and forming plural bonding layers on the insulation layer and an exposed portion of the sacrificial substrate, with the bonding layer having a first region formed on the insulation layer and a second region larger than the first region, formed on the exposed portion of the sacrificial substrate.

(14) There is also provided the method for manufacturing a semiconductor light emitting device of (10), wherein, after forming a light-transmitting protective layer for covering the opaque layer, the sacrificial substrate is removed to expose the second region of the bonding layer to an external substrate.

According to the present disclosure, it is possible to obtain ultra-small semiconductor light emitting devices constituting a pixel of an LED display.

According to the present disclosure, ultra-small semiconductor light emitting device constituting a pixel of an LED display can be obtained using micro semiconductor light emitting chips.

Using a semiconductor light emitting device according to the present disclosure facilitates the manufacturing process of an LED display.

What is claimed is:

1. A semiconductor light emitting device comprising:
two or more light emitting units, each including a first semiconductor layer having a first conductivity, an active layer for generating light by electron-hole recombination, and a second semiconductor layer having a second conductivity different from the first conductivity, with the first semiconductor layer, the active layer and the second semiconductor layer being sequentially formed on a growth substrate;
an electrode unit including a first semiconductor layer having a first conductivity and a metal layer formed on the first semiconductor layer;
two or more bonding layers for electrically connecting the light emitting units and electrode unit, respectively; and
an insulation layer located below the bonding layers, wherein:
each bonding layer has a first region on which the light emitting units and the electrode unit are arranged, and a second region having a larger planar area than that of the first region and being electrically connected to an external substrate; and
the second region of each bonding layer is spaced apart from the second regions of the other bonding layers on a planar surface of the insulation layer.

2. The semiconductor light emitting device of claim 1, wherein at least a bottom portion of the second region is exposed from the insulation layer.

3. The semiconductor light emitting device of claim 2, wherein the light emitting units include a first light emitting unit, a second light emitting unit and a third light emitting unit, and the bonding layers include a first bonding layer corresponding to the first light emitting unit, a second bonding layer corresponding to the second light emitting unit, a third bonding layer corresponding to the third light emitting unit, and a fourth bonding layer corresponding to the electrode unit.

4. The semiconductor light emitting device of claim 3, further comprising:
an encapsulating layer for covering the insulation layer, light emitting units and bonding layers,
wherein the first semiconductor layers of the light emitting units and electrode unit are exposed from the encapsulating layer.

5. The semiconductor light emitting device of claim 4, further comprising:
a transparent electrode layer for covering the encapsulating layer as well as at least portions of the first semiconductor layers of the light emitting units and electrode unit exposed from the encapsulating layer.

6. The semiconductor light emitting device of claim 5, wherein the first, second and third light emitting units emit lights of different colors.

7. The semiconductor light emitting device of claim 5, further comprising:

color coating layers showing different colors, formed on an upper surface of the transparent electrode layer corresponding to the first, second and third light emitting units, respectively.

8. The semiconductor light emitting device of claim 7, further comprising:

an opaque layer for covering the transparent electrode layer, wherein the color coating layers are exposed from the opaque layer.

9. The semiconductor light emitting device of claim 8, further comprising:

a light-transmitting protective layer for covering the opaque layer.

10. A method for manufacturing a semiconductor light emitting device, the method comprising:

forming, on a growth substrate, plural light emitting units and an electrode unit, in which each of the light emitting units includes a first semiconductor layer having a first conductivity, an active layer for generating light by electron-hole recombination, and a second semiconductor layer having a second conductivity different from the first conductivity, and the electrode unit includes a first semiconductor layer and a metal layer;

forming plural bonding layers on a sacrificial substrate;

electrically connecting the plural light emitting units and electrode unit to their corresponding bonding layers, respectively;

removing the growth substrate;

forming an encapsulating layer for covering the plural light emitting units, the electrode unit and the bonding layers, with the first semiconductor layers of the light emitting units and electrode unit being exposed from the encapsulating layer;

forming a transparent electrode layer for covering the encapsulating layer as well as at least portions of the first semiconductor layers of the light emitting units and electrode unit exposed from the encapsulating layer;

forming an opaque layer in such a way that upper surfaces of the plural light emitting units and electrode unit are exposed; and forming a light-transmitting protective layer for covering the opaque layer.

11. The method for manufacturing a semiconductor light emitting device of claim 10, wherein forming, on a growth substrate, plural light emitting units and an electrode unit, includes:

sequentially forming, on a growth substrate, a first semiconductor layer having a first conductivity, an active layer for generating light by electron-hole recombination, and a second semiconductor layer having a second conductivity different from the first conductivity;

forming plural light emitting units; and forming an electrode unit by selecting one of the light emitting units, and forming a metal layer on the first semiconductor layer that is left after the second semiconductor layer and the active layer are removed.

12. The method for manufacturing a semiconductor light emitting device of claim 11, further comprising:

after forming a metal layer on the first semiconductor layer that is left after the second semiconductor layer and the active layer are removed, forming an insulation layer on lateral surfaces of the plural light emitting units and of the electrode unit; and forming pad electrodes electrically connected to the second semiconductor of each of the light emitting units and to the metal layer of the electrode unit.

13. The method for manufacturing a semiconductor light emitting device of claim 10, wherein forming plural bonding layers on a sacrificial substrate includes:

forming an insulation layer on the sacrificial substrate;

exposing a portion of the sacrificial substrate from the insulation layer; and forming plural bonding layers on the insulation layer and an exposed portion of the sacrificial substrate, with the bonding layer having a first region formed on the insulation layer and a second region larger than the first region, formed on the exposed portion of the sacrificial substrate.

14. The method for manufacturing a semiconductor light emitting device of claim 10, wherein, after forming a light-transmitting protective layer for covering the opaque layer, the sacrificial substrate is removed to expose the second region of the bonding layer to an external substrate.

\* \* \* \* \*